US006229315B1

(12) United States Patent
Briggs

(10) Patent No.: US 6,229,315 B1
(45) Date of Patent: May 8, 2001

(54) HAND-HELD HARMONICS DETECTOR

(76) Inventor: Stephen J. Briggs, P.O. Box 9005, Champaign, IL (US) 61826

( * ) Notice: Subject to any disclaimer, the term of this patent is extended or adjusted under 35 U.S.C. 154(b) by 0 days.

(21) Appl. No.: 08/450,849

(22) Filed: May 25, 1995

(51) Int. Cl.[7] ..................... G01R 23/20

(52) U.S. Cl. ..................... 324/623

(58) Field of Search ..................... 324/76.21, 77.11, 324/520, 623, 115

(56) References Cited

U.S. PATENT DOCUMENTS 5,170,114 * 12/1992 Lowenstein et al. ................ 324/520
5,365,164 * 11/1994 Lowenstein et al. ................ 324/520
5,473,255 * 12/1995 Kunihiro et al. ................. 324/76.21

* cited by examiner

*Primary Examiner*—Louis Arana

(57) ABSTRACT

A device for detecting harmonics in a current carrying conductor, comprises current probe for placing adjacent a current carrying conductor, the current probe generating an output signal in response to the current in the conductor; a circuit operably connected to the current probe for processing the output signal from the current probe; the circuit including a switching portion responsive to the output of the current probe for automatically turning on or off the circuit when the current probe senses current in the electrical conductor; and a display for the output of the circuit for indicating the presence of harmonics in the conductor. The display includes a plurality of various colored LEDs that are lit depending on the severity of the harmonics of interest that are detected. The circuit also includes a microcontroller for computing the Fourier coefficients of the harmonics of interest and an automatic gain control feature for auto-ranging for various current inputs from the current probe.

17 Claims, 4 Drawing Sheets

30 TO CURRENT PROBE 2 6 6 44 V+ V+ V+ V+ V+ V+ 34 36 40 38 52 54 46 5V VOLTAGE REGULATOR 5V TO DIGITAL CIRCUIT 32 47 56 48 IC 50 53 58 VG 42 60 62 TO DIGITAL CIRCUIT 32

TO DIGITAL CIRCUIT 32
5V
47
44
TO DIGITAL CIRCUIT 32
62
60
5V VOLTAGE REGULATOR
46
40
$V_+$
42
$V_G$
TO CURRENT PROBE 2
6
36
54
52
34
48
50
58
IC
53
56
38
30

HAND-HELD HARMONICS DETECTOR

FIELD OF THE INVENTION

The present invention generally relates to a hand-held electrical measuring device and particularly to a harmonics detector for detecting the presents of harmonic currents on electrical power lines in industrial and residential facilities.

BACKGROUND OF THE INVENTION

Electrical distribution system components are designed to operate at the standard 60 Hz frequency. However, many loads found in industrial and residential facilities demand currents that are non-sinusoidal and may be mathematically represented as a Fourier series summation of a fundamental plus higher order harmonics. For example, switch mode power supplies found in computers and other office equipment draw highly non-sinusoidal currents rich in harmonics. Similarly, usage of adjustable speed drives (ASD) with rectifier and invertor circuits for induction motor speed control has contributed to much greater line current harmonic levels.

The presence of harmonic currents on electrical power lines is becoming a major problem for electrical power engineers. These currents are responsible for overheating transformers, circuit breakers, filters, and neutrals and other sometimes strange occurrences. Harmonic problems are, by their nature, non-local; the equipment or system damaged by harmonics may be some distance from the source of harmonics.

Detection, diagnosis, and mitigation of harmonic problems require specialized instrumentation to accurately assess the level of harmonics present in the system. Instrumentation available to field engineers is generally inadequate to perform any detection or assessment of harmonics. While harmonic analysis equipment is available commercially, it is expensive, bulky, and overly complex, which makes it inappropriate and frequently unavailable for the field engineer who is called upon to diagnose equipment failures. This lack of instrumentation leads to improper diagnosis of problems and failure to correct harmonic problems as they occur.

Currently several commercial vendors manufacture equipment for performing this type of analysis. The primary drawback of the equipment is that they are not designed for ease of use. As a primary diagnostic instrument, the harmonics detector should be carried by field personnel whenever diagnostic measurements are made on electrical power lines. Even if no specific problems are present, the instrument should be used in a preventive role, to determine if harmonic currents are present in excessive amounts in the system. However, the various instruments currently available share the following characteristics, which render their use unlikely:

These units have retail prices in the range of $1,000 to $10,000 and up. Instrumentation in this price range is not generally available to field personnel.

These instruments are relatively larger (some are suitcase size and weigh 30 lbs) and inconvenient to transport; this renders it unlikely that they will be carried to the trouble site.

While some allow for battery operation, many of them require AC power for operation, severely limiting their usefulness in the field, where 120 V outlets are seldom available at the trouble site.

They are complex instruments and a significant investment of time is required to learn their operation and few personnel are knowledgeable in their use. In particular, field personnel generally lack the training to use the equipment effectively.

Some require the use of a PC (personal computer) to analyze dafa.

For these reasons, the existing equipment is not carried by field personnel, and hence is not generally used for problem diagnosis and is seldom, if ever, used in a preventive maintenance manner.

There is therefore a need for a hand-held harmonics detector that solves the above problems.

OBJECTS AND SUMMARY OF THE INVENTION

It is an object of the present invention to provide a low cost, easy to use, light-weight (typically 8 oz.), hand-held harmonics detector that will allow service engineers and technicians to diagnose harmonics probl It is another object of the present invention to provide a hand-held harmonics detector completely based on commercial off-the-shelf components, including low-power CMOS circuitry and a low-cost microcontroller.

It is still another object of the present invention to provide a hand-held harmonics detector which can be produced at relatively low cost.

It is yet another object of the present invention to provide a hand-held harmonics detector that operates from a relatively small battery, such as a 9 volt battery.

It is another object of the present invention to provide a hand-held harmonics detector that has auto sensing for power on/off operation, sensing the presence of current to turn the detector on and switching off when the current is not present, thereby conserving battery life and providing convenience of use.

It is still another object of the present invention to provide a hand-held harmonics detector that has the capability to measure 3rd, 5th, 7th, 9th and 11th harmonics.

It is still another object of the present invention to provide a hand-held harmonics detector that measures current, since current harmonics are almost always present in higher levels and are a better indicator of potential harmonics problems than voltage harmonics. This advantage allows the use of a current probe to minimize safety hazards, since voltage inputs and dangerous voltages are avoided.

It is yet another object of present invention to provide a hand-held harmonics detector with auto-sensing for 60 Hz of 50 Hz (European) operation.

It is another object of present invention to provide a hand-held harmonics detector with a simple, easy to understand light emitting diode (LED) display for output.

In summary, the present invention provides a hand-held harmonics detector comprising current probe for placing adjacent a current carrying conductor, the current probe generating an output signal in response to the current in the conductor; a circuit operably connected to the current probe for processing the output signal from the current probe; the circuit including a switching portion responsive to the output of the current probe for automatically turning on or off the circuit when the current probe senses current in the electrical conductor; and a display for the output of the circuit for indicating the presence of harmonics in the conductor. The display includes a plurality of various colored LEDs that are lit depending on the severity of the harmonics of interest that are detected. The circuit also includes a microcontroller for computing the Fourier coefficients of the harmonics of interest and an automatic gain control feature for auto-ranging for various current inputs from the current probe.

These and other objects of the present invention will become apparent from the following detailed description.

DETAILED DESCRIPTION OF THE INVENTION

Figure 1:
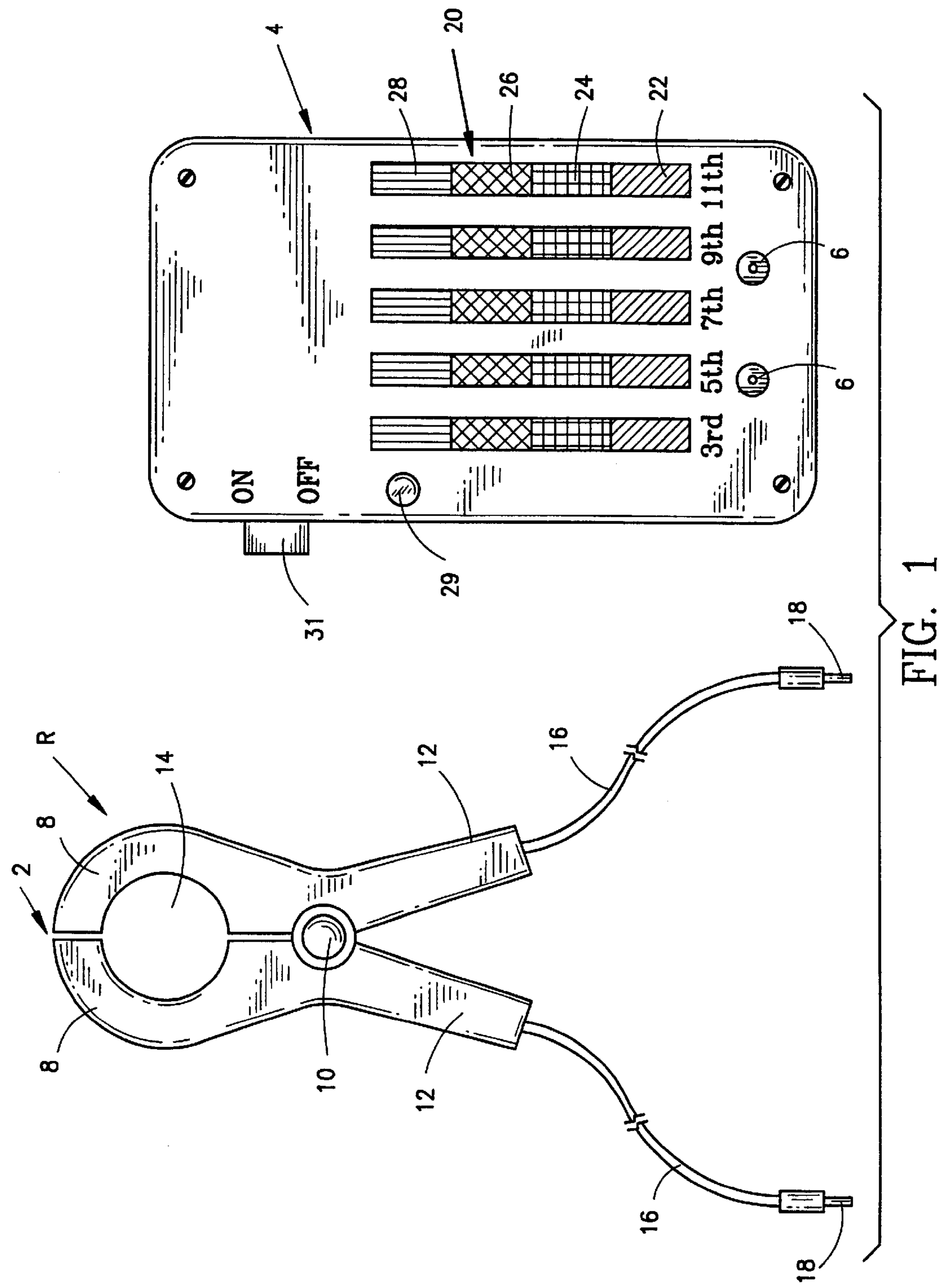
FIG. 1 is a perspective view of a hand-held harmonics detector made in accordance with the present invention.

A hand-held harmonics detector R made in accordance with the present invention is disclosed in FIG. 1. The detector R comprises a standard clamp-on current probe 2 connected to a detector unit 4 by means of a pair of input connectors or jacks 6. The probe 2 is a current transformer that advantageously allows the detector R to work with a wide range of currents, from 0.1 A to many thousands of amperes. The use of the current probe 2 also advantageously eliminates the requirements for high voltage or current isolation, since the isolation is already provided by the probe itself.

The current probe 2 has a pair of opposing jaws 8 that are pivotable about pivot 10 such that when handle portions 12 are squeezed together, the jaws 8 separate from each other, providing a gap (not shown) between the jaws 8 through which the current carrying conductor (not shown) that is being tested could be disposed within the opening 14. Current transformers (not shown) disposed within the jaws 8 sense the magnetic field around the conductor being tested, providing an input to the detector unit 4 via wires 16. The wires 16 are provided with male connectors 18 that are designed to be received within the female connectors 6 in the detector unit 4.

The detector unit 4 has a light emitting diode (LED) display 20 for output. Each harmonic (3rd, 5th, 7th, 9th, 11th) has four LED's 22, 24, 26 and 28 associated with it. The LED's 22, 24, 26 and 28 are green, yellow, orange and red, respectively. For each harmonic, set points are programmed in for lighting up each LED so that the color-coded bar graph indicator is obtained for each harmon These set points are different for each harmonic and are based on the IEEE-519 standard and the IEC-552-2 standard. The user is appraised of the severity of the problem based on which LED is lit for each harmonic of interest. The degree of the harmonics problem is indicated by the LEDs. Green light means low level of harmonics, yellow means slightly greater level of harmonics, orange is much greater level of harmonics and red is the greatest level of harmonics.

A power on/off LED indicator 29 is provided in the display 20. The indicator 29 is lit when the unit 4 is powered.

Figure 2:
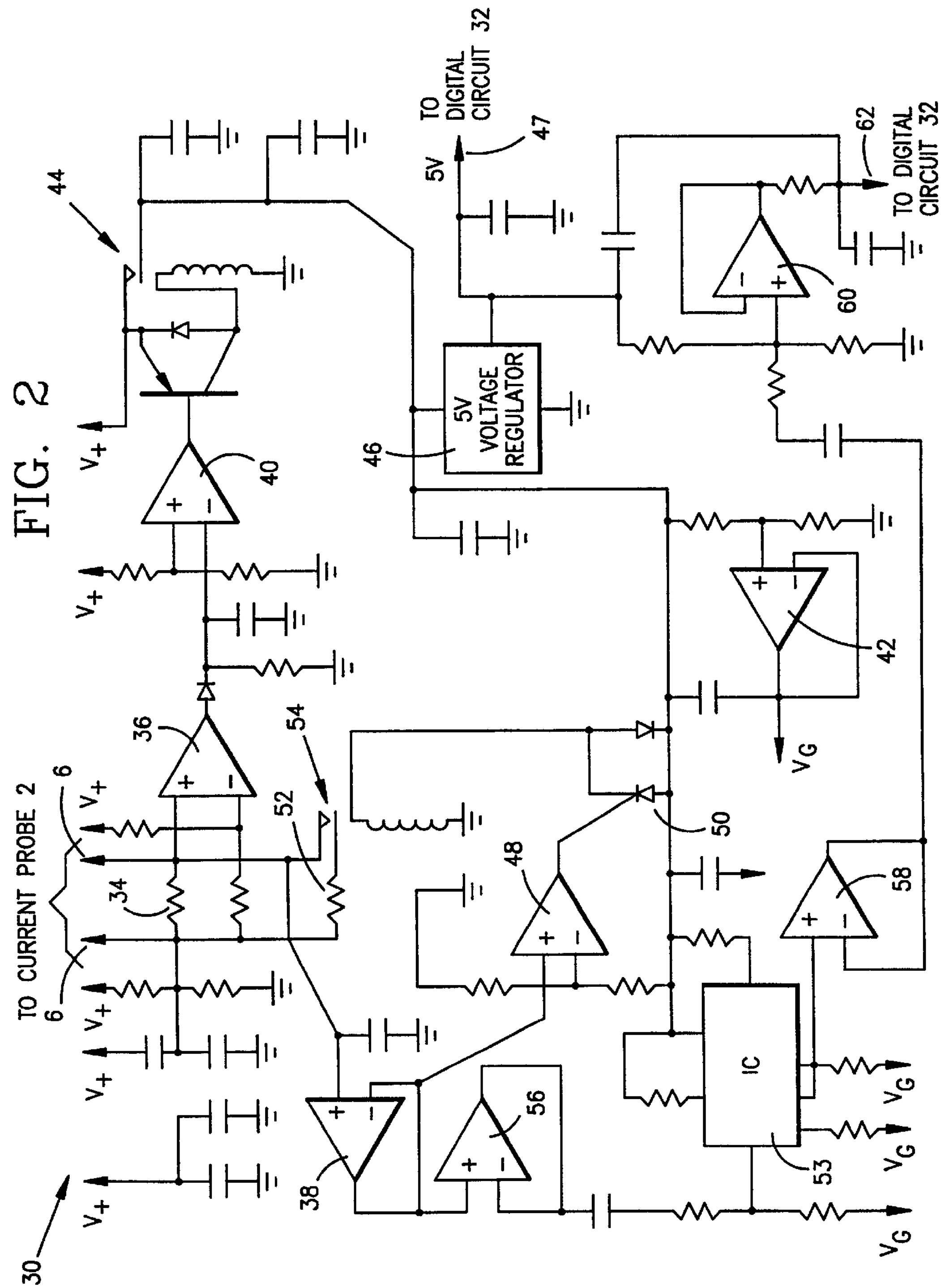
FIG. 2 is a schematic diagram of an analog circuit used in the detector of FIG. 1 in accordance with the present invention.
Figure 3:
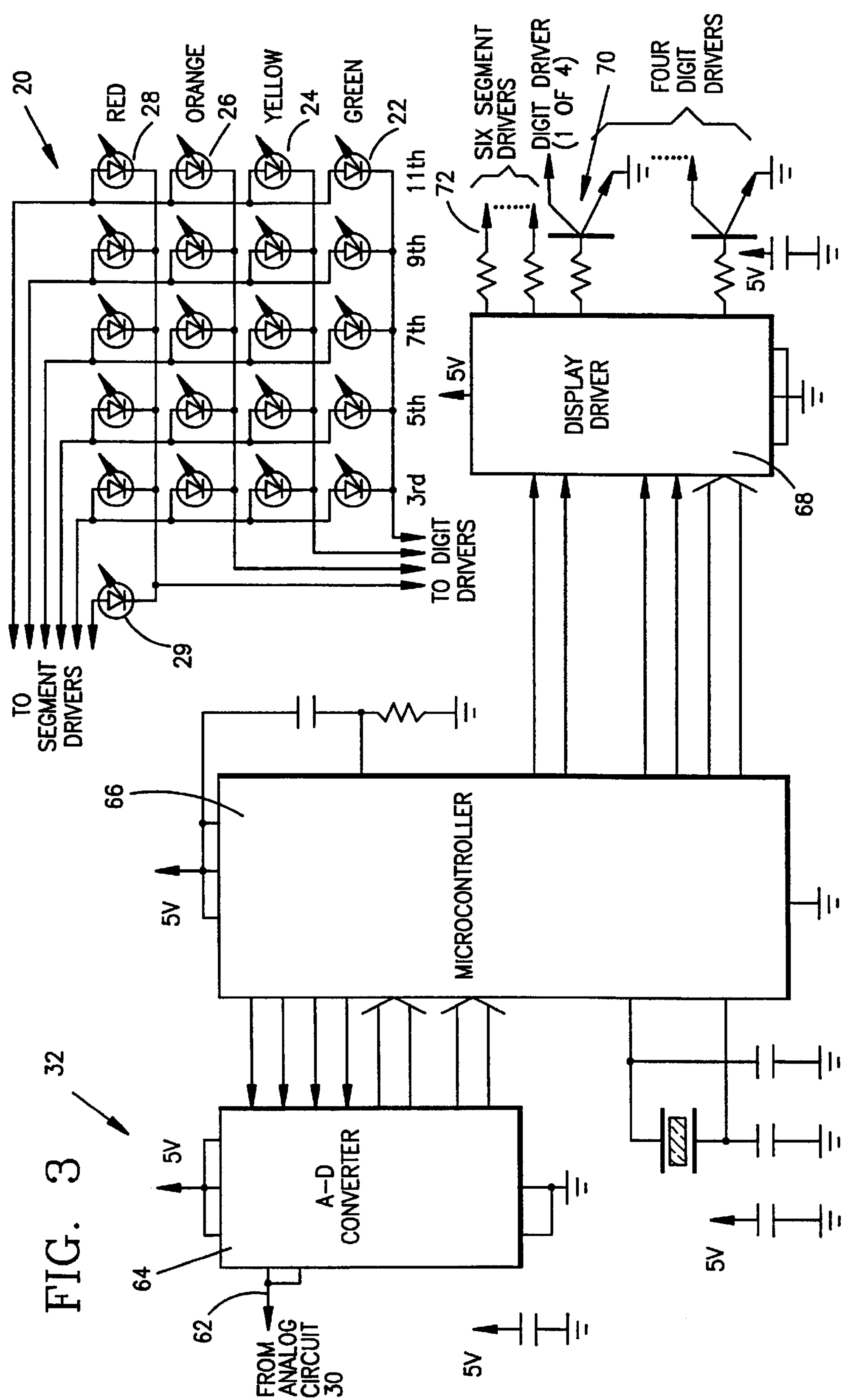
FIG. 3 is a schematic diagram of a digital circuit used in the detector of FIG. 1 in accordance with the present invention.

The detector unit 4 comprises an analog circuit 30 and a digital circuit 32, as best shown in FIGS. 2 and 3. The current for the current probe 2 feeds a resistor 34, which generates a voltage, feeding operational amplifiers 36 and 38, as best shown in FIG. 2. The analog circuit 30 includes a power control circuit that advantageously provides the means for sensing current into probe R and turning the remainder of the circuit on or off, depending on the presence of current in the probe R. This feature conserves battery life and results in a battery life in excess of one year (depending on battery type). Operational amplifiers 36, 38 and 40 are always powered. The rest of the analog circuit 30 is powered through a relay 44. Power for the detector unit 4 is obtained from a 9 volt battery, providing V., as best shown in FIG. 2.

The operational amplifiers 36 and 40 comprise a rectifier and level detector stage. When the current probe R detects a current, an AC voltage is generated which is rectified and detected by the operational amplifier 40. The operational amplifier 40 then turns on the relay 44, which provides power to the rest of the detector unit of 4. When the current probe R is removed from the current carry conductor (not shown) being tested, the AC voltage goes to 0, the operational amplifier 40 turns off the relay 44, and the detector unit 4 turns off.

The operational amplifier 42 generates a voltage, $V_o$ midway between the battery voltage and ground. A voltage regulator 46, such National Semiconductor Part No. LM340T, provides 5 volts for the digital circuit 32, generally indicated at 47.

The analog circuit 30 includes a gain control circuit that advantageously provides an auto-ranging function to scale the current input so that the peak-to-peak AC voltage signal fed to the analog/digital converter in the circuit 32 is always approximately the battery voltage. This advantageously ensures accurate operation of the unit 4 over the widest range of current inputs.

Two types of gain control are provided. The first is a circuit which varies the value of the current transformer burden resistor 34, depending on the voltage developed across the resistor. The output from the operational amplifier 38 feeds operational amplifier 48, which, along with SCR (silicon controlled rectifier) 50 comprises a peak detector and latch. If an over-range current is present, the operational amplifier 48 will detect a high peak and fire the SCR 50, which will result in an additional resistor 52 being placed in parallel with the resistor 34, thereby reducing the voltage drop across the inputs from the current probe R and increasing the current range. Relay 54 is energized when the SCR 50 is fired, thereby connecting the resistor 52 in parallel with resistor 34. Consequently, an over-current input from the current probe R will result in lower voltage drop.

The other gain control circuit consists of a circuit 53 called operational transconductance amplifier with linearizing diode and buffers, available from National Semiconductor as Part No. LM13600. The circuit 53 is designed to act as an automatic gain control circuit. The circuit 53 takes the output from the operational amplifier 56, which ranges from 30 mV signal to a 4 V signal and produces a signal in the range of 0.5 V to 2 V. Operational amplifier 58 is an output buffer for this circuit and amplifier 60 adjusts the DC offset voltage prior to the signal going to the analog to digital converter of the digital circuit 32.

One quad-amp package may be used for the operational amplifiers 36, 38, 40 and 48 and another quad-amp package for the operational amplifiers 56, 58, 42 and 60. This choice advantageously simplifies construction of the circuit 30.

Referring to FIG. 3, the analog signal from the analog circuit 30 coming from output 62 is digitized by an analog to digital converter 64, such as that available from National Semiconductor, Part No. AD7880. The 12-bit output of the AD converter 64 is loaded into an Intel 87C51H microcontroller 66, which preforms all the signal analysis. The microcontroller 66 determines the level of harmonics in the signal and outputs data to a display driver and latch 68, such as that available from National Semiconductor, Part No. MM74C911. The integrated circuit 68 drives four digit driver transistors 70, each transistor driving all five of one color LED's. Each column in the display 20 (i.e. power, 3rd, 5th, 7th, 9th and 11th harmonics) is driven by an output line 72 from the integrated circuit 68. The digital output circuit provides the necessary hardware so that the output of the microcontroller 66 can drive the five separate multicolored LED bar graph displays, one for each harmonic of interest.

Figure 4:
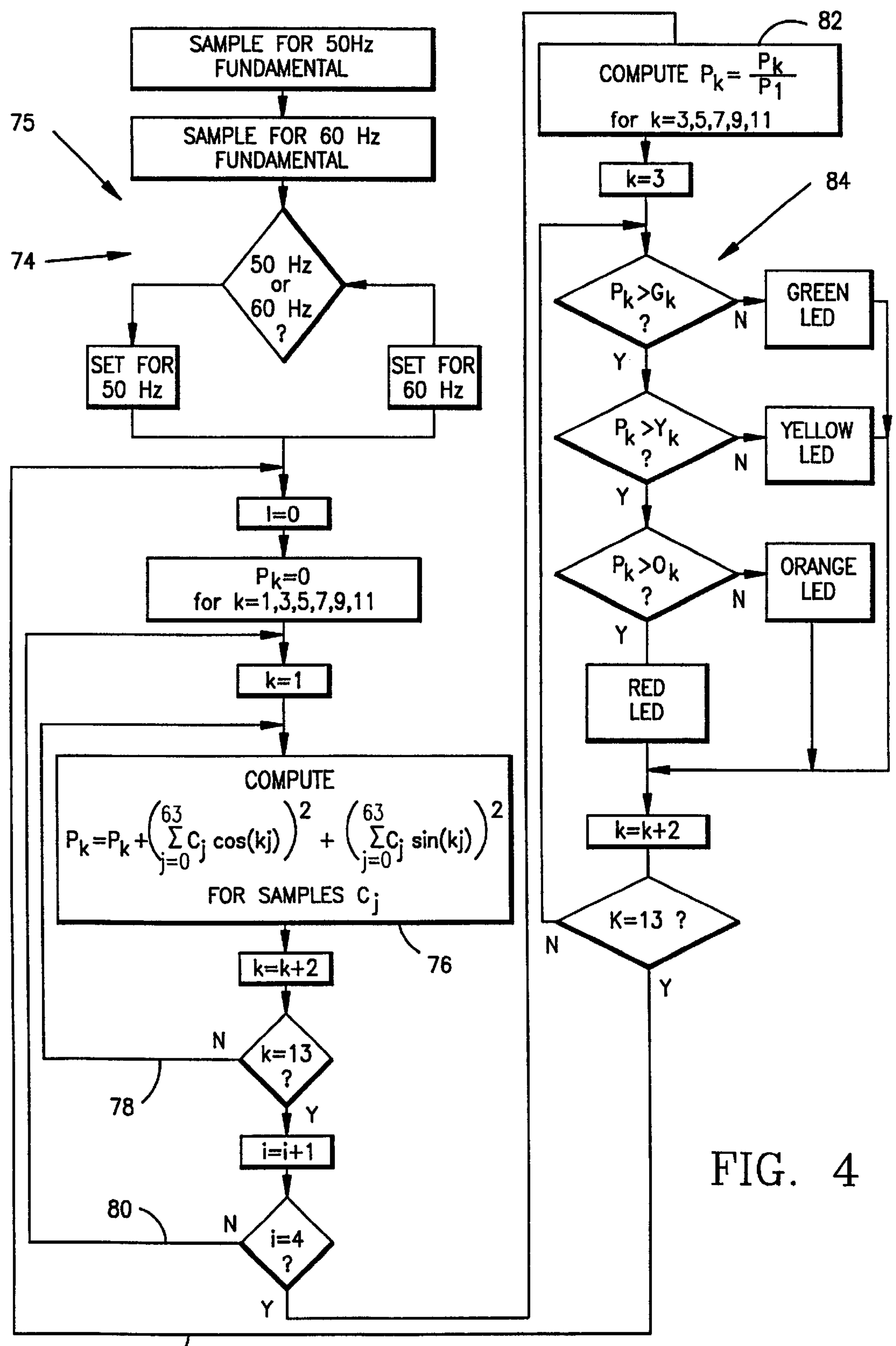
FIG. 4 is a flow chart of a software used in the detector of FIG. 1.

The software for the microcontroller 66 is included as Appendix A and a flow chart 74 of the software is disclosed in FIG. 4.

The microcontroller 66 first determines whether a 50 Hz or 60 Hz signal is present by sampling at 1920 Hz (60 Hz times 32 samples/cycle) and then sampling at 1600 Hz (50 Hz times 32 samples/cycle). This step is generally indicated at 75. For each rate, the software determines the amount of fundamental signal present, and uses that information to determine whether the signal source fundamental is 50 Hz or 60 Hz. The software then adjusts its sample rate to account for the difference, sampling at 3840 Hz for a 60 Hz signal or 3200 Hz for a 50 Hz signal.

After determining the proper frequency, the software goes into its main computational routine. The main routine consist of four nested loops; the outermost loop is an infinite loop that the software remains in as long as power is applied. The inner loops consist of (from the innermost to outermost) a loop over 64 samples, a loop over different numbered harmonics, and an averaging loop.

In the innermost loop 76, the software samples the current 64 times and computes the Fourier coefficient for harmonic k. The next loop 78 then repeats the sampling over all the Fourier components of interest, namely k equals 1, 3, 5, 6, 7, 9 and 11. Then, this process is repeated four times in the next loop 80 to obtain an average value for the magnitudes of $P_k$, k=1, 3, 5, 7, 9 and 11.

The $P_k$ are then normalized at step 82 to the fundamental by division by $P_1$.

Finally, for each relevant k, $P_k$ is compared to a series of set points to determine which color LED to light up for each harmonic. This step is generally indicated at 84. The outer loop is generally indicated at 86.

In operation, the current carrying conductor that is being investigated is placed within the opening 14 of the current probe R by squeezing the handles 12 and permitting the conductor to pass through the resulting gap between the jaws 8. The signal picked up by the probe 2 is fed to the detector unit 4 via the connectors 6. The detector unit 4 automatically turns itself on when it auto-senses 50 Hz or 60 Hz and advantageously auto-ranges to select the proper current range for the input.

The detector R advantageously provides a simple easy to interpret, go-no-go type of indicator. This eliminates the need for the operator to be trained in investigating harmonics problems. The operator merely has to know that if the red LED's light up on the detector that significant harmonics are present and further investigation is required. After use, the operator merely removes the current probe 2 from the current-carrying conductor, thereby automatically turning off the detector unit 4. This advantageously conserves the battery life.

Current harmonics are in general a better indicator of potential harmonics problems than voltage harmonics. This specific design advantageously allows the total cost and complexity of the detector to be minimized, instrument safety to be maximized and interpretation of results to be easy. This combination of safety and ease of interpretation of results allows the detector to be used with very minimal operator training.

It should be understood to a person of ordinary skill in the art that the choices of the specific components are arbitrary. The operational amplifies 36, 38, 40 and 48 should preferably be very low power to conserve battery life (ideally under 100 $\mu$A current drain per amp). The other operational amplifiers 42, 56, 58, and 60 are general purpose units, available in hundreds of configurations from several vendors. The particular choice of using quad amps (for operational amplifiers in a single package) is likewise arbitrary and was made to advantageously simplify construction. All the transistors are common small signal NPN and PNP type transistors, used simply as switches. The microcontroller 66 could easily be replaced by another microcontroller and the code transferred to the new controller without loss of function.

While this invention has been described as having preferred design, it is understood that it is capable of further modification, uses and/or adaptations following in general the principle of the invention and including such departures from the present disclosure as come within known or customary practice in the art to which the invention pertains, and as may be applied to the essential features set forth, and fall within the scope of the invention or the limits of the appended claims.

I claim:

1. A device for detecting harmonics in a current carrying conductor, comprising:

a) current probe for placing adjacent a current carrying conductor, said current probe generating an output signal in response to the current in the conductor;

b) a circuit operably connected to said current probe for processing the output signal from said current probe;

c) said circuit including a switching portion responsive to the output of said current probe for automatically turning on or off said circuit when said current probe senses current in the electrical conductor; and d) a display for the output of said circuit for indicating the presence of harmonics in the conductor.

2. A device as in claim 1, wherein:

a) said switching portion includes a relay adapted to be energized by the output from said current probe.

3. A device as in claim 2, wherein:

a) a power source connected to said relay; and b) said relay is adapted to connect said power source to said circuit when said relay is energized.

4. A device as in claim 1, wherein:

a) said circuit includes first and second portions;

b) a said first portion is connected to said current probe; and c) a switch connected to a power source and said second portion, said switch adapted to be energized when said current probe senses current, thereby connecting the power source to said second portion.

5. A device as in claim 1, wherein:

a) said circuit includes an analog portion and a digital portion; and b) said switching portion is disposed in said analog portion.

6. A device as in claim 1, wherein:

a) said circuit includes an analog portion and a digital portion; and b) said digital portion includes a programmable microcontroller adapted to compute the Fourier coefficients of the output signal from said current probe.

7. A device as in claim 6, wherein:

a) said programmable controller being adapted to compare the computed Fourier coefficients with a set of preset values; and b) said programmable controller is operably connected to said display to indicate the relative magnitude of the Fourier coefficients of the harmonics of interest.

8. A device as in claim 6, wherein:

a) said programmable controller is adapted to determine the fundamental frequency of the output signal of said current probe.

9. A device as in claim 1, wherein:

a) said circuit includes an automatic gain control portion for scaling the output signal from said current probe within a range.

10. A device as in claim 9, wherein:

a) the output signal of said current probe is connected across a first resistor; and b) said automatic gain control portion includes a second resistor adapted to be connected across said first resistor when the output signal of said current probe exceeds a preset level.

11. A device as in claim 10, wherein:

a) said automatic gain control portion includes a SCR (silicon controlled rectifier) adapted to detect an over-range current from said current probe;

b) a relay adapted to be energized when said SCR is fired; and c) said relay is adapted to connect said second resistor across said first resistor.

12. A device as in claim 1, wherein:

a) said display includes a plurality of LEDs, each LED being associated with a level harmonic of interest.

13. A device as in claim 12, wherein:

a) said display includes a plurality of LEDs arranged in columns, each column being associated with a harmonic of interest; and b) each LED in each of said column indicating the degree of severity of harmonic of interest present in the current carrying conductor.

14. A device as in claim 13, wherein:

a) said plurality of LEDs in each of said column including green, yellow, orange and red LEDs; and b) said green LED indicating least degree of severity for the harmonic of interest, said red LED indicating most degree of severity, and said yellow and orange LEDs indicating intermediate degree of severity.

c) said green LED indicating least degree of severity for the harmonic of interest, said red LED indicating most degree of severity, and said yellow and orange LEDs indicating intermediate degree of severity.

15. A device as in claim 1, wherein:

a) said circuit includes a microcontroller; and b) a software programmed in said microcontroller for determining the Fourier coefficients of the harmonics of interest.

16. A device as in claim 15, wherein:

a) said software is adapted to determine the fundamental frequency of the current in the current carrying conductor.

17. A device as in claim 16, wherein:

a) said software is adapted to determine the degree of severity of the harmonics of interest.

* * * * *